(12) United States Patent
Bahl et al.

(10) Patent No.: US 8,318,563 B2
(45) Date of Patent: Nov. 27, 2012

(54) GROWTH OF GROUP III NITRIDE-BASED STRUCTURES AND INTEGRATION WITH CONVENTIONAL CMOS PROCESSING TOOLS

(75) Inventors: Sandeep R. Bahl, Palo Alto, CA (US); Abdalla Naem, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 243 days.

(21) Appl. No.: 12/800,606

(22) Filed: May 19, 2010

(65) Prior Publication Data
US 2011/0284859 A1 Nov. 24, 2011

(51) Int. Cl.
*H01L 21/336* (2006.01)
(52) U.S. Cl. .................. 438/285; 257/192; 257/E21.441
(58) Field of Classification Search .......... 257/190–201, 257/E29.255, E29.091, E21.441; 438/172, 438/191, 604, 285
See application file for complete search history.

(56) References Cited

U.S. PATENT DOCUMENTS

| | | | |
|---|---|---|---|
| 5,239,188 A | 8/1993 | Takeuchi et al. | |
| 6,168,659 B1 | 1/2001 | Yuri et al. | |
| 6,649,287 B2 | 11/2003 | Weeks, Jr. et al. | |
| 6,940,098 B1 * | 9/2005 | Tadatomo et al. | 257/87 |
| 7,179,667 B2 * | 2/2007 | Okagawa et al. | 438/22 |
| 7,294,200 B2 | 11/2007 | Fujikura et al. | |
| 7,301,205 B2 | 11/2007 | Matsumori | |
| 7,312,134 B2 | 12/2007 | Chidambarrao et al. | |
| 7,374,618 B2 | 5/2008 | Yoshida | |
| 7,569,461 B2 * | 8/2009 | Lee et al. | 438/481 |
| 7,598,108 B2 | 10/2009 | Li et al. | |
| 2003/0087462 A1 | 5/2003 | Koide et al. | |
| 2004/0063300 A1 | 4/2004 | Chi | |
| 2005/0124143 A1 | 6/2005 | Roycroft et al. | |

(Continued)

FOREIGN PATENT DOCUMENTS

EP 1 280 190 A1 1/2003
(Continued)

OTHER PUBLICATIONS

Notification of Transmittal of the International Search Report and the Written Opinion of the International Searching Authority, or the Declaration dated Jun. 27, 2011 in connection with International Patent Application No. PCT/US2010/058296.

(Continued)

*Primary Examiner* — Kiesha Bryant
*Assistant Examiner* — Ali Naraghi
(74) *Attorney, Agent, or Firm* — Wade J. Brady, III; Frederick J. Telecky, Jr.

(57) ABSTRACT

A method includes forming a non-continuous epitaxial layer over a semiconductor substrate. The substrate includes multiple mesas separated by trenches. The epitaxial layer includes crystalline Group III nitride portions over at least the mesas of the substrate. The method also includes depositing a dielectric material in the trenches. The method could also include forming spacers on sidewalls of the mesas and trenches or forming a mask over the substrate that is open at tops of the mesas. The epitaxial layer could also include Group III nitride portions at bottoms of the trenches. The method could further include forming gate structures, source and drain contacts, conductive interconnects, and conductive plugs over at least one crystalline Group III nitride portion, where at least some interconnects and plugs are at least partially over the trenches. The gate structures, source and drain contacts, interconnects, and plugs could be formed using standard silicon processing tools.

17 Claims, 6 Drawing Sheets

U.S. PATENT DOCUMENTS

| | | |
|---|---|---|
| 2005/0285150 A1 | 12/2005 | Birner et al. |
| 2007/0105274 A1 | 5/2007 | Fitzgerald |
| 2007/0105335 A1 | 5/2007 | Fitzgerald |
| 2007/0155121 A1 | 7/2007 | Frohberg et al. |
| 2008/0296625 A1 | 12/2008 | Li et al. |
| 2009/0085166 A1 | 4/2009 | Iwamuro |
| 2009/0179227 A1* | 7/2009 | Otake et al. .................. 257/192 |
| 2010/0308437 A1* | 12/2010 | Okuno et al. ................. 257/615 |

FOREIGN PATENT DOCUMENTS

WO     WO 2009/015350 A1     1/2009

OTHER PUBLICATIONS

European Search Report dated Dec. 22, 2011 in connection with European Patent Application No. EP 11 17 8555.

Abdalla Naem, et al., "Method for Forming High-Quality Gallium Nitride Structures on Silicon or Other Substrates and Related Apparatus", U.S. Appl. No. 12/577,576, filed Oct. 12, 2009.

Sandeep R. Bahl, et al., "Growth of Multi-Layer Group III-Nitride Buffers on Large-Area Silicon Substrates and Other Substrates", U.S. Appl. No. 12/807,336, filed Sep. 2, 2010.

A. Able, et al., "Growth of crack-free GaN on Si(1 1 1) with graded AlGaN buffer layers", Journal of Crystal Growth, 276, Jan. 22, 2005, p. 415-418.

R. Liu, et al., "Atomic arrangement at the AlN/Si (111) interface", Applied Physics Letters, vol. 83, No. 5, Aug. 4, 2003, p. 860-862.

"GaN Essentials, AN-011: Substrates for GaN RF Devices", Nitronex Corporation, Jun. 2008, 10 pages.

H. Miyake, et al., "Growth of crack-free AlGaN on selective-area-growth GaN", Journal of Crystal Growth 310, Aug. 22, 2008, p. 4885-4887.

Jamal Ramdani, "Stress Compensation for Large Area Gallium Nitride or Other Nitride-Based Structures on Semiconductor Substrates", U.S. Appl. No. 12/927,947, filed Nov. 30, 2010.

* cited by examiner

GROWTH OF GROUP III NITRIDE-BASED STRUCTURES AND INTEGRATION WITH CONVENTIONAL CMOS PROCESSING TOOLS

TECHNICAL FIELD

This disclosure is generally directed to integrated circuits. More specifically, this disclosure is directed to the growth of Group III nitride-based structures and integration with conventional complimentary metal oxide semiconductor (CMOS) processing tools.

BACKGROUND

Gallium nitride (GaN) can be used in manufacturing high-speed or high-power integrated circuit devices. Gallium nitride is often desirable because it can withstand high operating temperatures and can provide high breakdown voltages compared to standard silicon devices. Gallium nitride can also typically provide good high-frequency performance. As a result, gallium nitride may be effectively used in applications such as high-power microwave applications (like in cellular base stations) and high-efficiency power regulation applications (like in electric vehicles).

Native gallium nitride substrates are not generally available. Instead, gallium nitride epitaxial layers are often formed over silicon-based substrates using metal-organic chemical vapor deposition (MOCVD), molecular beam epitaxy (MBE), hydride vapor phase epitaxy (MOPVE), or metal-organic vapor phase epitaxy (MOPVE) techniques. Silicon carbide (SiC) substrates could be used here, but they are often expensive and limited in size. Ordinary silicon substrates could also be used here, but it is often difficult to form high-quality gallium nitride epitaxial layers over large silicon substrates, such as substrates with six or eight inch diameters. This could be due to a number of factors, such as high stress levels, large thermal expansion coefficient mismatches, high defect densities, and wafer bowing.

The inability to form thick high-quality gallium nitride layers can reduce the breakdown voltage of field effect transistors (FETs), high electron mobility transistors (HEMTs), or other devices formed using the gallium nitride layers. As a particular example, it may only be possible to form a gallium nitride layer that is 2-3 μm thick over a six-inch silicon wafer, which could provide a breakdown voltage of approximately 600V. It may not be possible to grow thicker gallium nitride layers in order to provide higher breakdown voltages. Even if it was possible, it would likely require special processing tools to further fabricate semiconductor devices using the gallium nitride layers.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

FIGS. 1A through 1G illustrate a first example technique for forming a semiconductor device having high-quality Group III nitride structures according to this disclosure. The technique shown in FIGS. 1A through 1G is for illustration only. Other techniques could be used to form the semiconductor device without departing from the scope of this disclosure.

In the following description, a "Group III nitride" refers to a compound formed using nitrogen and at least one Group III element. Example Group III elements include indium, gallium, and aluminum. Specific Group III nitrides that could be used here include gallium nitride (GaN), aluminum gallium nitride (AlGaN), indium aluminum nitride (InAlN), indium aluminum gallium nitride (InAlGaN), aluminum nitride (AlN), and indium gallium nitride (InGaN).

Figure 1A:
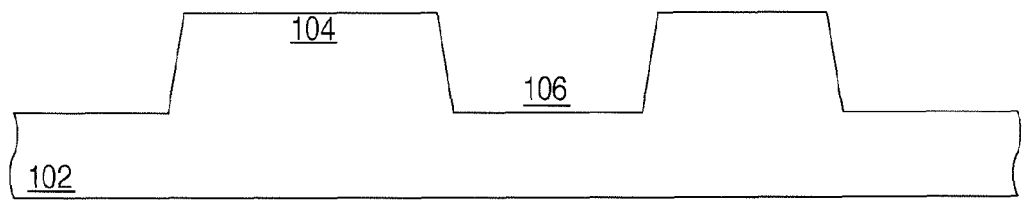
FIGS. 1A through 1G illustrate a first example technique for forming a semiconductor device having high-quality Group III nitride structures according to this disclosure.

As shown in FIG. 1A, a semiconductor substrate 102 is provided. The semiconductor substrate 102 could represent any suitable semiconductor substrate. For example, the semiconductor substrate 102 could represent a silicon substrate. As a particular example, the semiconductor substrate 102 could represent a relatively large silicon wafer, such as a silicon wafer having a diameter of six inches, eight inches, or more. Note that any other suitable substrate could be used, such as a silicon carbide or sapphire wafer.

In this example, the substrate 102 is formed or processed to include mesas 104 and trenches 106. The mesas 104 represent raised or higher areas of the substrate 102, while the trenches 106 represent indented or lower areas of the substrate 102. In some embodiments, the substrate 102 in FIG. 1A could be formed by etching the trenches 106 in the substrate 102, where the mesas 104 are located between the trenches 106. In particular embodiments, the mesas 104 represent areas of the substrate 102 above which transistor devices or other devices are fabricated during later processing steps.

Figure 1B:
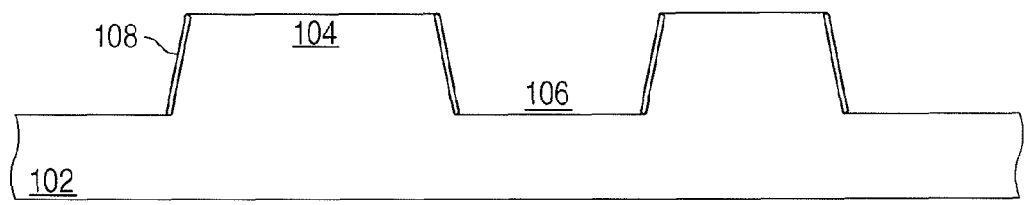

As shown in FIG. 1B, sidewall spacers 108 are formed on sidewalls of the mesas 104/trenches 106. The sidewall spacers 108 could be formed using any suitable material(s), such as a silicon oxide or other dielectric material. The sidewall spacers 108 could also be formed using any suitable technique(s), such as by growing or depositing the dielectric material and then blanket-etching the dielectric material using an anisotropic etch. This causes the dielectric material to substantially cover the sidewalls of the mesas 104/trenches 106, forming the sidewall spacers 108. This also exposes portions of the substrate 102 at the tops of the mesas 104 and at the bottoms of the trenches 106.

Figure 1C:
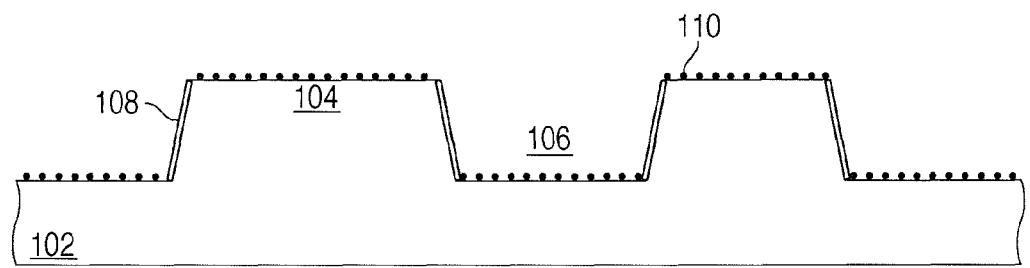

As shown in FIG. 1C, a nucleation layer 110 is formed in or over the structure. In this example, the nucleation layer 110 represents nucleated portions of the exposed substrate 102 at the tops of the mesas 104 and at the bottoms of the trenches 106. The nucleation layer 110 could be formed from any suitable material(s), such as aluminum nitride (AlN). The nucleation layer 110 could also be formed in any suitable manner, such as by performing an implantation.

Figure 1D:
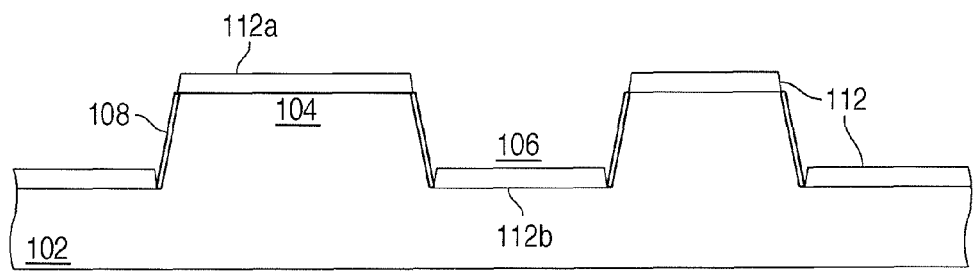

As shown in FIG. 1D, an epitaxial layer 112 is formed over the substrate 102 using the nucleation layer 110. The epitaxial layer 112 could be formed from any suitable material(s), such as a Group III nitride (like GaN, AlGaN, InAlN, InAlGaN, AlN, or InGaN). The epitaxial layer 112 could also be formed using any suitable technique(s), such as metal-organic chemical vapor deposition (MOCVD), molecular beam epitaxy (MBE), hydride vapor phase epitaxy (MOPVE), or metal-organic vapor phase epitaxy (MOPVE) techniques.

In this example, the epitaxial layer 112 is non-continuous, with portions 112a at the tops of the mesas 104 and portions 112b at the bottoms of the trenches 106. These portions 112a-112b could generally represent different areas of crystalline Group III nitride. This creates the epitaxial layer 112 as a non-continuous film or other layer. By forming the epitaxial layer 112 in this way, each portion 112a-112b effectively has "expansion joints" along its edges, which can (among other things) help to accommodate stress from thermal coefficient mismatches.

Figure 1E:
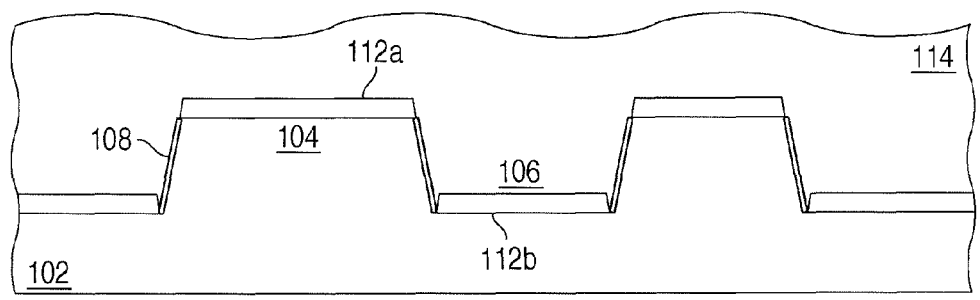
Figure 1F:
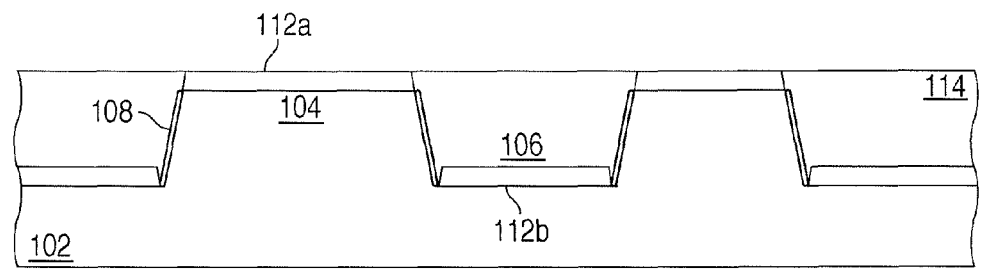

A dielectric film 114 is formed over the structure as shown in FIG. 1E and planarized as shown in FIG. 1F. The dielectric film 114 could include any suitable material(s), such as an oxide. The dielectric film 114 could also be formed using any suitable technique(s), such as a high-density plasma (HDP) chemical vapor deposition (CVD) technique. In addition, the dielectric film 114 could be planarized using any suitable technique(s), such as a chemical mechanical polish (CMP). The planarization could expose the portions 112a of the epitaxial layer 112.

Figure 1G:
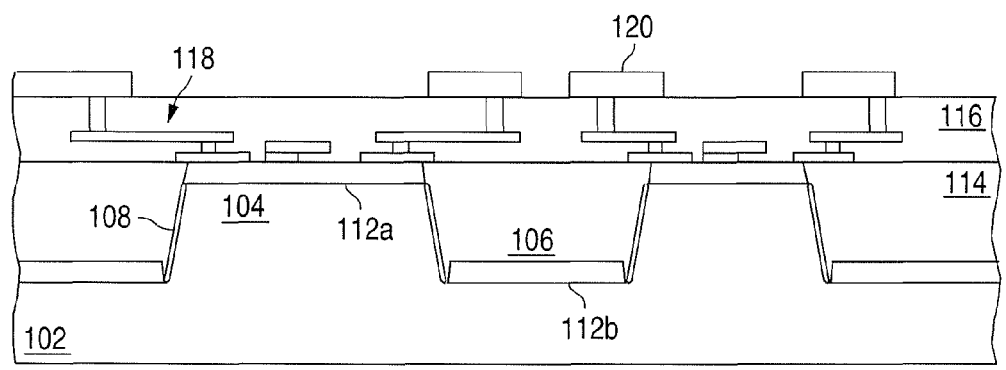

At the point shown in FIG. 1F, the structure could represent a "Group III nitride wafer" or other structure that is ready for further processing. The further processing could include standard complimentary metal oxide semiconductor (CMOS) processing steps performed using standard CMOS tools and techniques. For example, as shown in FIG. 1G, at least one inter-level dielectric (ILD) layer or other dielectric layer 116 could be formed over the structure. Also, various structures 118 can be formed in the dielectric layer(s) 116. The dielectric layer 116 includes any suitable number of layers formed from any suitable dielectric material(s). The structures 118 could include any suitable structures for forming transistor devices or other devices, such as gate structures, source and drain contacts, metal interconnects, and conductive plugs. As shown in FIG. 1G, various ones of these structures 118 are formed over the "wasted" areas of the structure (over the trenches 106 where no devices are formed using the portions 112b of the epitaxial layer 112). Also, in these embodiments, the epitaxial layer 112 could represent a buffer layer for the transistor devices or other devices. In addition, conductive structures 120 can be formed over the dielectric layer 116 to provide electrical connection to external signal lines. The conductive structures 120 could be formed in any suitable manner using any suitable material(s), such as by depositing and etching a metal layer.

Figure 2:
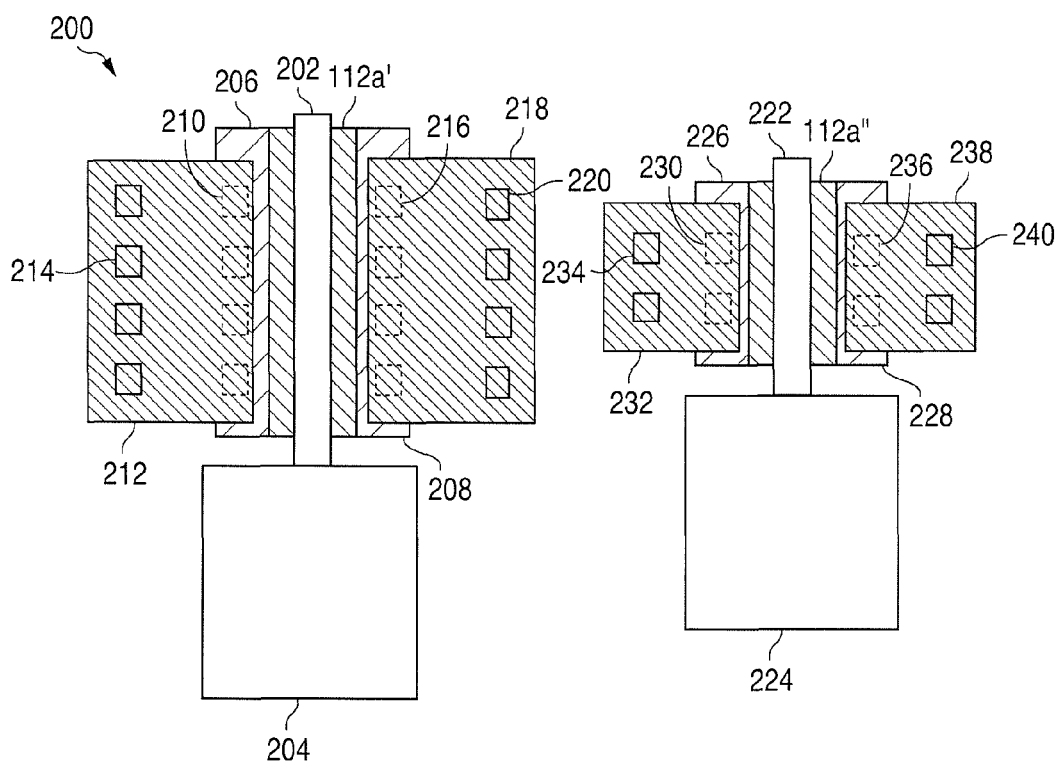
FIG. 2 illustrates an example top view of the semiconductor device formed in FIGS. 1A through 1G according to this disclosure.

FIG. 2 illustrates an example top view 200 of the semiconductor device formed in FIGS. 1A through 1G according to this disclosure. The top view 200 shown in FIG. 2 is for illustration only. Devices having other top views could be formed using the technique shown in FIGS. 1A through 1G without departing from the scope of this disclosure.

In the example shown in FIG. 2, a gate structure 202 is formed over the left portion 112a' of the epitaxial layer 112. The gate structure 202 is in electrical contact with a gate pad 204, which could be electrically connected to other circuitry in a larger device. A source contact 206 and a drain contact 208 are also formed over the left portion 112a' of the epitaxial layer 112. The source contact 206 could be in electrical contact with a first contact area of the portion 112a' of the epitaxial layer 112. The drain contact 208 could be in electrical contact with a second contact area of the portion 112a' of the epitaxial layer 112. One or more conductive plugs 210 electrically couple the source contact 206 to a conductive interconnect 212, which is electrically coupled to other components (such as a conductive structure 120) by one or more conductive plugs 214. Similarly, one or more conductive plugs 216 electrically couple the drain contact 208 to a conductive interconnect 218, which is electrically coupled to other components by one or more conductive plugs 220.

In a similar manner, a gate structure 222 is formed over the right portion 112a" of the epitaxial layer 112. The gate structure 222 is in electrical contact with a gate pad 224. A source contact 226 and a drain contact 228 are also formed over the right portion 112a" of the epitaxial layer 112. The source contact 226 could be in electrical contact with a first contact area of the portion 112a" of the epitaxial layer 112. The drain contact 228 could be in electrical contact with a second contact area of the portion 112a" of the epitaxial layer 112. One or more conductive plugs 230 electrically couple the source contact 226 to a conductive interconnect 232, which is electrically coupled to other components by one or more conductive plugs 234. One or more conductive plugs 236 electrically couple the drain contact 228 to a conductive interconnect 238, which is electrically coupled to other components by one or more conductive plugs 240.

Each of these components 202-240 could be formed from any suitable conductive material(s). Each of these components 202-240 could also be formed using any suitable technique(s), such as standard CMOS techniques (although specialized techniques could also be used). In this example, two transistor devices of differing sizes are formed, although any number of devices could be fabricated in the same or similar manner and have any suitable size(s).

Although FIGS. 1A through 1G illustrate one example technique for forming a semiconductor device having high-quality Group III nitride structures and FIG. 2 illustrates one example top view of the semiconductor device formed in FIGS. 1A through 1G, various changes may be made to FIGS. 1A through 1G and 2. For example, each element in the structure could be fabricated using any suitable material(s) and any suitable technique(s). Also, the relative sizes and shapes of the elements in the structure could be modified according to particular needs. In addition, the epitaxial layer 112 could actually represent multiple epitaxial layers, each containing one or more Group III nitrides. For instance, the epitaxial layer 112 could represent a multilayer structure of AlGaN/GaN/AlGaN, where the AlGaN layers have different aluminum mole-fractions to provide stress-compensation in the GaN buffer layer.

FIGS. 3A through 3G illustrate a second example technique for forming a semiconductor device having high-quality Group III nitride structures according to this disclosure. The technique shown in FIGS. 3A through 3G is for illustration only. Other techniques could be used to form the semiconductor device without departing from the scope of this disclosure.

Figure 3A:
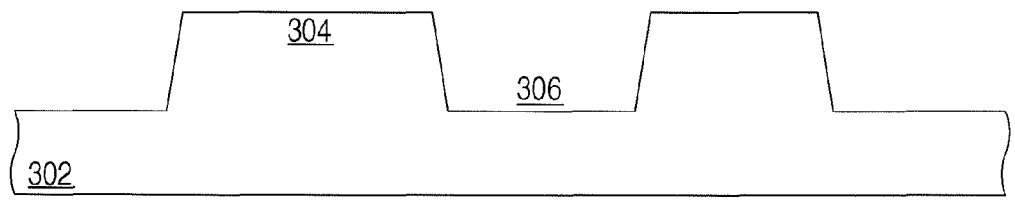
FIGS. 3A through 3G illustrate a second example technique for forming a semiconductor device having high-quality Group III nitride structures according to this disclosure.

As shown in FIG. 3A, a semiconductor substrate 302 with mesas 304 and trenches 306 is provided. The semiconductor substrate 302 could represent any suitable semiconductor substrate, such as a relatively large silicon wafer (although other substrates could be used).

Figure 3B:
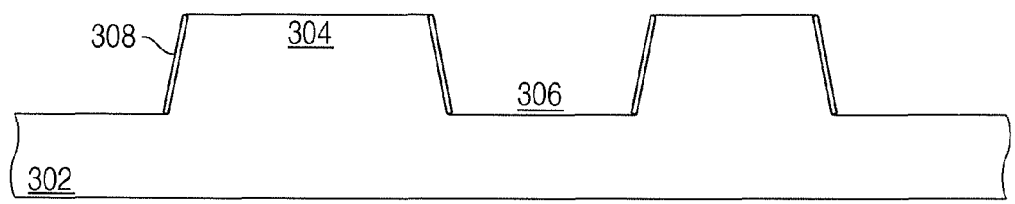

As shown in FIG. 3B, a dielectric mask 308 is formed over the substrate 302. The dielectric mask 308 is etched or otherwise processed to substantially remove the mask 308 from the tops of the mesas 304 (or the mask 308 is not formed over the tops of the mesas 304). The dielectric mask 308 can be removed from the tops of the mesas 304 using any suitable technique, such as CMP or by masking with photoresist and etching. The dielectric mask 308 could be formed using any suitable material(s) and using any suitable technique(s). Portions of the substrate 302 at the tops of the mesas 304 are exposed, but not at the bottoms of the trenches 306.

Figure 3C:
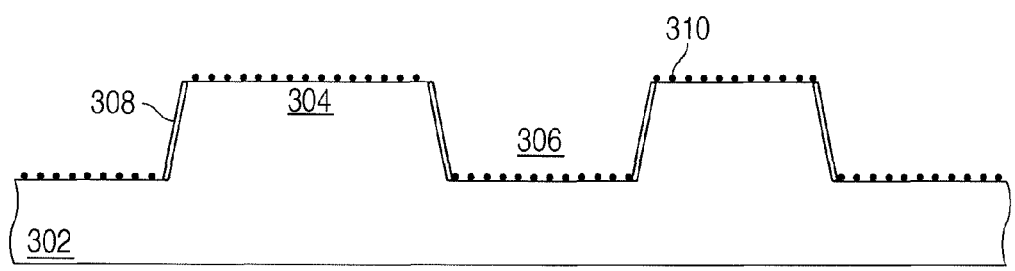

As shown in FIG. 3C, a nucleation layer 310 is formed in or over the structure. In this example, the nucleation layer 310 nucleates the exposed substrate 302 at the tops of the mesas 304. The nucleation layer 310 could be formed from any suitable material(s) and in any suitable manner.

Figure 3D:
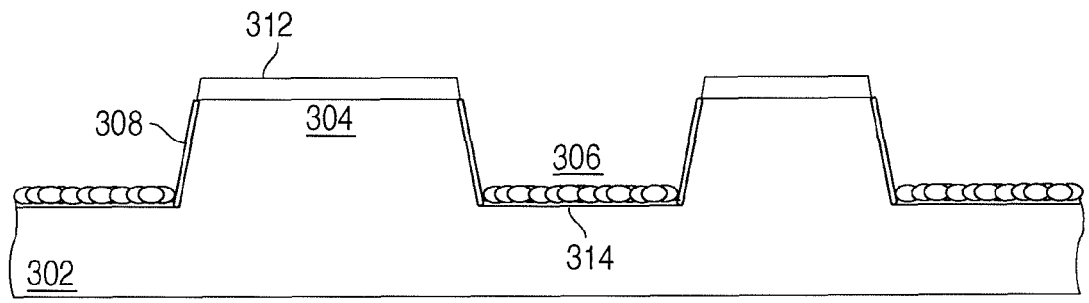

As shown in FIG. 3D, an epitaxial layer 312 is formed over the substrate 302 using the nucleation layer 310. In this example, the epitaxial layer 312 is formed at the tops of the mesas 304. These portions of the epitaxial layer 312 could generally represent different areas of crystalline Group III nitride. Again, the epitaxial layer 312 is a non-continuous film or other layer. The formation of the epitaxial layer 312 may or may not lead to the creation of amorphous or semi-amorphous material 314 (such as amorphous gallium nitride or other Group III nitride) at the bottoms of the trenches 306. This amorphous or semi-amorphous material 314 can be removed during later steps or remain at the bottoms of the trenches 306 (where it might not affect the remainder of the structure).

Figure 3E:
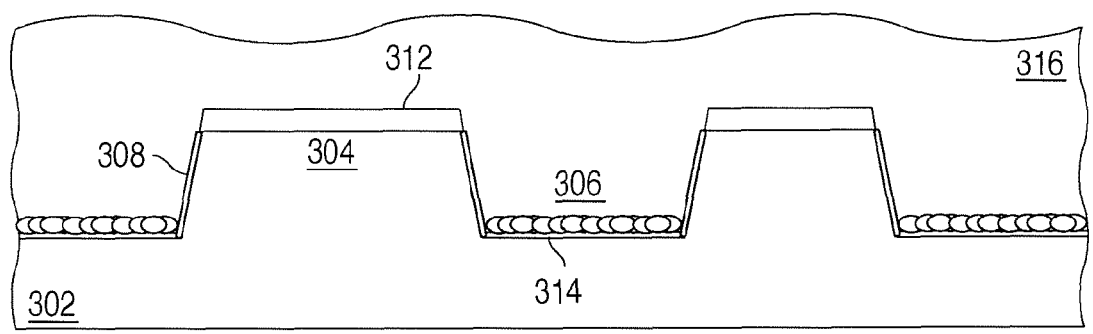
Figure 3F:
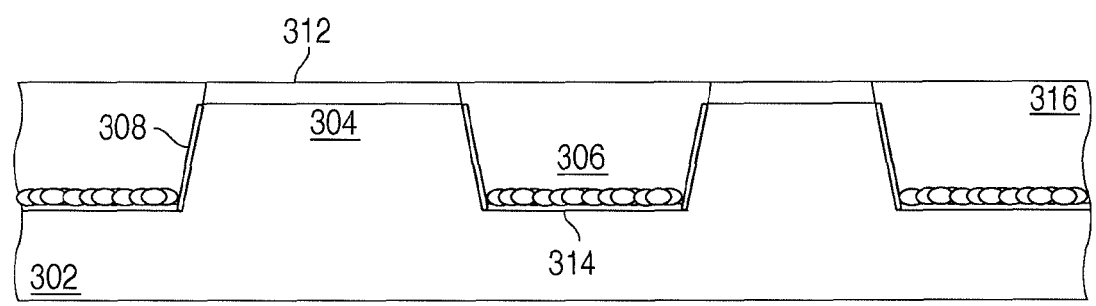
Figure 3G:
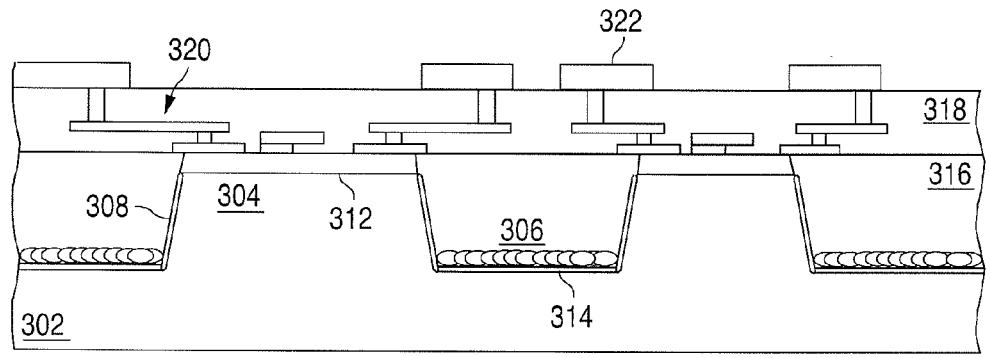

A dielectric film 316 is formed over the structure as shown in FIG. 3E and planarized as shown in FIG. 3F. At the point shown in FIG. 3F, the structure could represent a "Group III nitride wafer" or other structure that is ready for further processing, such as using standard CMOS processing steps with standard CMOS tools and techniques. For example, as shown in FIG. 3G, at least one ILD or other dielectric layer 318 could be formed over the structure, and various structures 320 can be formed in the dielectric layer 318, such as structures for forming transistor devices. Conductive structures 322 can also be formed over the dielectric layer 318.

In particular embodiments, each of the mesas 304 could represent individual integrated circuit chips being fabricated, such as 1 cm by 1 cm mesas. Also, the trenches 306 could be formed in the locations of scribe lines, which represent areas where the substrate 302 will be cut to separate the integrated circuit chips. This effectively allows the formation of a Group III nitride epitaxial layer 312 over the entire surface of the substrate 302, except in locations where the epitaxial layer 312 would have been removed anyway in order to separate the chips.

Although FIGS. 3A through 3G illustrate another example technique for forming a semiconductor device having high-quality Group III nitride structures, various changes may be made to FIGS. 3A through 3G. For example, each element of the structure could be fabricated using any suitable material(s) and any suitable technique(s). Also, the relative sizes and shapes of the elements in the structure could be modified according to particular needs. In addition, the epitaxial layer 312 could actually represent multiple epitaxial layers, each containing one or more Group III nitrides.

In either of the techniques shown in FIGS. 1A-1G and 3A-3G, thicker Group III nitride layers (such as 3 μm or more thick) could be formed on larger silicon or other wafers (such as wafers with six inch or greater diameters). For example, when any continuous portion of the Group III nitride epitaxial layer covers no more than a 1 cm by 1 cm area, the epitaxial layer could have up to a 5 μm thickness or even more. By restricting the lateral dimensions of the Group III nitride using a non-continuous epitaxial layer, this can help to reduce or minimize the effects of stress on the Group III nitride, allowing these greater thicknesses to be achieved.

Figure 4:
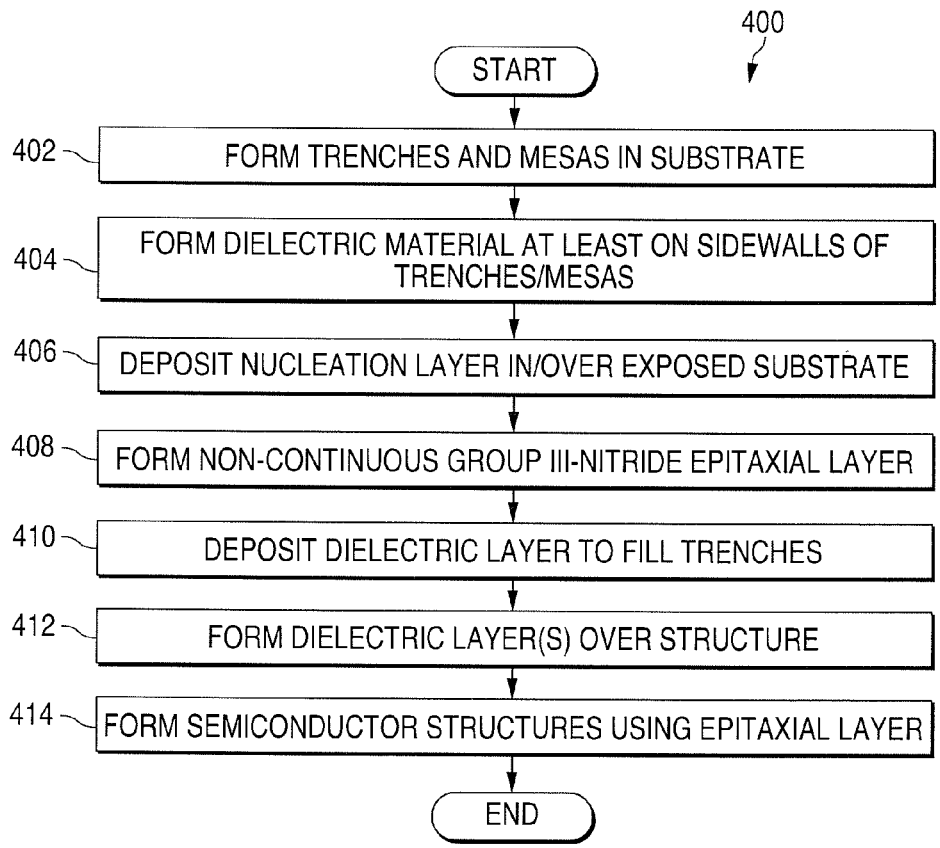
FIG. 4 illustrates an example method for forming a semiconductor device having high-quality Group III nitride structures according to this disclosure.

FIG. 4 illustrates an example method 400 for forming a semiconductor device having high-quality Group III nitride structures according to this disclosure. The method 400 shown in FIG. 4 is for illustration only. Other methods could be used without departing from the scope of this disclosure. Also, for ease of explanation, the method 400 is described with respect to the technique shown in FIGS. 1A through 1G.

As shown in FIG. 4, mesas and trenches are formed in a substrate at step 402. This could include, for example, forming trenches 106 in the substrate 102 by sawing, etching, or other technique. The areas between the trenches 106 may form the mesas 104. Note that any suitable number of trenches 106 can be used to form any suitable number of mesas 104.

A dielectric material is deposited, grown, or otherwise formed at least on sidewalls of the mesas/trenches at step 404. This could include, for example, oxidizing a portion of the substrate 102 or depositing the dielectric material over the substrate 102. This may also include etching the dielectric material to leave the dielectric material at least on the sidewalls, forming sidewall spacers 108. Depending on the embodiment, the dielectric material may or may not remain at the bottoms of the trenches 106 in the substrate 102.

A nucleation layer is formed in or over exposed portions of the substrate at step 406. This could include, for example, nucleating the areas of the substrate 102 not covered by the dielectric material formed in the prior step. A Group III nitride epitaxial layer is formed at step 408. This could include, for example, forming a gallium nitride or other epitaxial layer 112 having portions 112a-112b located over the nucleated portions of the substrate 102. The epitaxial layer 112 includes crystalline portions at the tops of the mesas 104 and may or may not include crystalline portions at the bottoms of the trenches 106.

A dielectric layer is deposited to fill the trenches at step 410. This could include, for example, depositing and planarizing the dielectric film 114. Additional dielectric layer(s) are formed at step 412 and additional semiconductor structure(s) are formed at step 414. This could include, for example, forming source and drain contacts and gate structures. This could also include forming additional structures electrically coupled to the source and drain contacts and gate structures. This could further include performing implantations or other procedures to dope and/or electrically insulate or isolate portions of the epitaxial layer. The epitaxial layer could be used in any other suitable manner to form any suitable semiconductor devices.

Although FIG. 4 illustrates one example of a method 400 for forming a semiconductor device having high-quality Group III nitride structures, various changes may be made to FIG. 4. For example, while shown as a series of steps, various steps in FIG. 4 could overlap, occur in parallel, occur in a different order, or occur multiple times.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising: forming a non-continuous epitaxial layer over a semiconductor substrate, the semiconductor substrate comprising multiple mesas separated by trenches, the epitaxial layer comprising crystalline Group III nitride portions over at least the mesas of the substrate; and depositing a dielectric material in the trenches; forming source and drain contacts and gate structures over at least one crystalline Group III nitride portion; and forming conductive interconnects and conductive plugs in electrical connection with the source and drain contacts and gate structures, wherein at least some of the conductive interconnects and plugs are at least partially over the trenches.

2. The method of claim 1, wherein the formation of the source and drain contacts, the formation of the gate structures, and the formation of the interconnects and plugs occur using standard silicon processing tools.

3. The method of claim 1, further comprising:
doping at least a portion of the epitaxial layer.

4. The method of claim 1, where at least a portion of the epitaxial layer is electrically insulating.

5. The method of claim 1, further comprising:
forming spacers on sidewalls of the mesas and trenches;
wherein forming the epitaxial layer further comprises forming crystalline Group III nitride portions at bottoms of the trenches.

6. The method of claim 1, further comprising:
forming a mask over the substrate that is open at tops of the mesas;
wherein forming the epitaxial layer further comprises forming amorphous Group III nitride portions at bottoms of the trenches.

7. The method of claim 1, further comprising:
forming the trenches at locations of the substrate associated with scribe lines.

8. The method of claim 1, wherein depositing the dielectric material in the trenches comprises:
depositing the dielectric material in the trenches and over the crystalline Group III nitride portions; and
planarizing the dielectric material to expose the crystalline Group III nitride portions that are over the mesas.

9. A semiconductor substrate structure comprising: a substrate comprising multiple mesas separated by trenches; a non-continuous epitaxial layer over the substrate, the epitaxial layer comprising crystalline Group III nitride portions over at least the mesas of the substrate; and a dielectric material in the trenches, gate structures and source and drain contacts over at least one of the crystalline Group III nitride portions; and conductive interconnects and conductive plugs in electrical connection with the source and drain contacts and gate structures.

10. The semiconductor substrate structure of claim 9, wherein at least some of the conductive interconnects and plugs are at least partially over the trenches.

11. The semiconductor substrate structure of claim 9, further comprising:
spacers on sidewalls of the mesas and trenches;
wherein the epitaxial layer further comprises crystalline Group III nitride portions at bottoms of the trenches.

12. The semiconductor substrate structure of claim 9, further comprising:
a mask over the substrate that is open at tops of the mesas;
wherein the epitaxial layer further comprises amorphous Group III nitride portions at bottoms of the trenches.

13. The semiconductor substrate structure of claim 9, wherein:
the substrate has a diameter of at least six inches; and
the crystalline Group III nitride portions comprise at least one of: gallium nitride (GaN), aluminum gallium nitride (AlGaN), indium aluminum nitride (InAlN), indium aluminum gallium nitride (InAlGaN), aluminum nitride (AlN), and indium gallium nitride (InGaN).

14. A semiconductor device comprising a substrate structure and at least one transistor device in or over the substrate structure, the substrate structure comprising: a substrate structure and at least one transistor device in or over the substrate structure, the substrate structure comprising: a substrate having multiple mesas separated by trenches; a non-continuous epitaxial layer over the substrate, the epitaxial layer comprising crystalline Group III nitride portions over at least the mesas of the substrate; and a dielectric material in the trenches, the at least one transistor device comprises gate structures and source and drain contacts over at least one of the crystalline Group III nitride portions; and the semiconductor device further comprises conductive interconnects and conductive plugs in electrical connection with the source and drain contacts and gate structures, wherein at least some of the conductive interconnects and plugs are at least partially over the trenches.

15. The semiconductor device of claim 14, wherein:
the substrate structure further comprises spacers on sidewalls of the mesas and trenches; and
the epitaxial layer further comprises crystalline Group III nitride portions at bottoms of the trenches.

16. The semiconductor device of claim 14, wherein:
the substrate structure further comprises a mask over the substrate and open at tops of the mesas; and
the epitaxial layer further comprises amorphous Group III nitride portions at bottoms of the trenches.

17. The semiconductor device of claim 14, wherein:
the substrate has a diameter of at least six inches; and
the crystalline Group III nitride portions comprise at least one of: gallium nitride (GaN), aluminum gallium nitride (AlGaN), indium aluminum nitride (InAlN), indium aluminum gallium nitride (InAlGaN), aluminum nitride (AlN), and indium gallium nitride (InGaN).

* * * * *